(12) United States Patent
Peon et al.

(10) Patent No.: US 6,195,030 B1
(45) Date of Patent: Feb. 27, 2001

(54) METHOD AND ELECTRONIC CIRCUITRY FOR PROVIDING A STABLE DIGITAL TO ANALOG CONVERTER ANALOG OUTPUT IN INTEGRATED CIRCUIT DIGITAL TO ANALOG CONVERTER APPLICATIONS

(75) Inventors: Rogelio Peon, Gijon (ES); Maarten Visee, Houten (NL)

(73) Assignee: Lucent Technologies Inc., Murray Hill, NJ (US)

( * ) Notice: Subject to any disclaimer, the term of this patent is extended or adjusted under 35 U.S.C. 154(b) by 0 days.

(21) Appl. No.: 09/335,578

(22) Filed: Jun. 18, 1999

(30) Foreign Application Priority Data

Jun. 23, 1998 (EP) .................................................. 98500148

(51) Int. Cl.[7] ..................................................... H03M 1/66
(52) U.S. Cl. ........................................... 341/144; 341/119
(58) Field of Search .................................... 341/144, 118, 341/119, 145, 153, 154

(56) References Cited

U.S. PATENT DOCUMENTS 5,731,772 * 3/1998 Mikkola et al. ...................... 341/118
5,790,060 * 8/1998 Tesch .................................... 341/119

FOREIGN PATENT DOCUMENTS 92117841 10/1992 (EP) ................................ H03M/1/66

OTHER PUBLICATIONS

Henriques, B.G. et al "A 10 Bit Low–Power CMOS D/A Converter With On–Chip Gain Error Compensation" "Proceedings Of The Custom Integrated Circuits Conference, Santa Clara, May 1–4, 1995 conf. #7, May 1, 1995" pp. 215–218.

European Search Report, dated Nov. 23, 1998.

* cited by examiner

*Primary Examiner*—Brian Young

(57) ABSTRACT

A method and electronic circuitry for providing a Digital to Analog converter analog output in Integrated Circuit Digital to Analog Converter applications, said analog output being stable over temperature and supply changes, independent on transistor parameters of a particular chip, and stable for transistor parameter variation from chip to chip. An integrated circuit reference cell is implemented; an internal (secondary) reference quantity determining the analog Digital to Analog Converter (DAC) output is generated; the said internal (secondary) reference quantity for the Digital to Analog converter is referenced to on-chip device specific internal (primary) reference output from the chip in question, and the said chip device specific internal (primary) reference output, is processed further in order to derive a fixed predetermined DAC reference value, that is equal for any chip; and said fixed predetermined DAC reference value is supplied to the digital input of said Digital to Analog converter.

18 Claims, 2 Drawing Sheets

Figure 1:
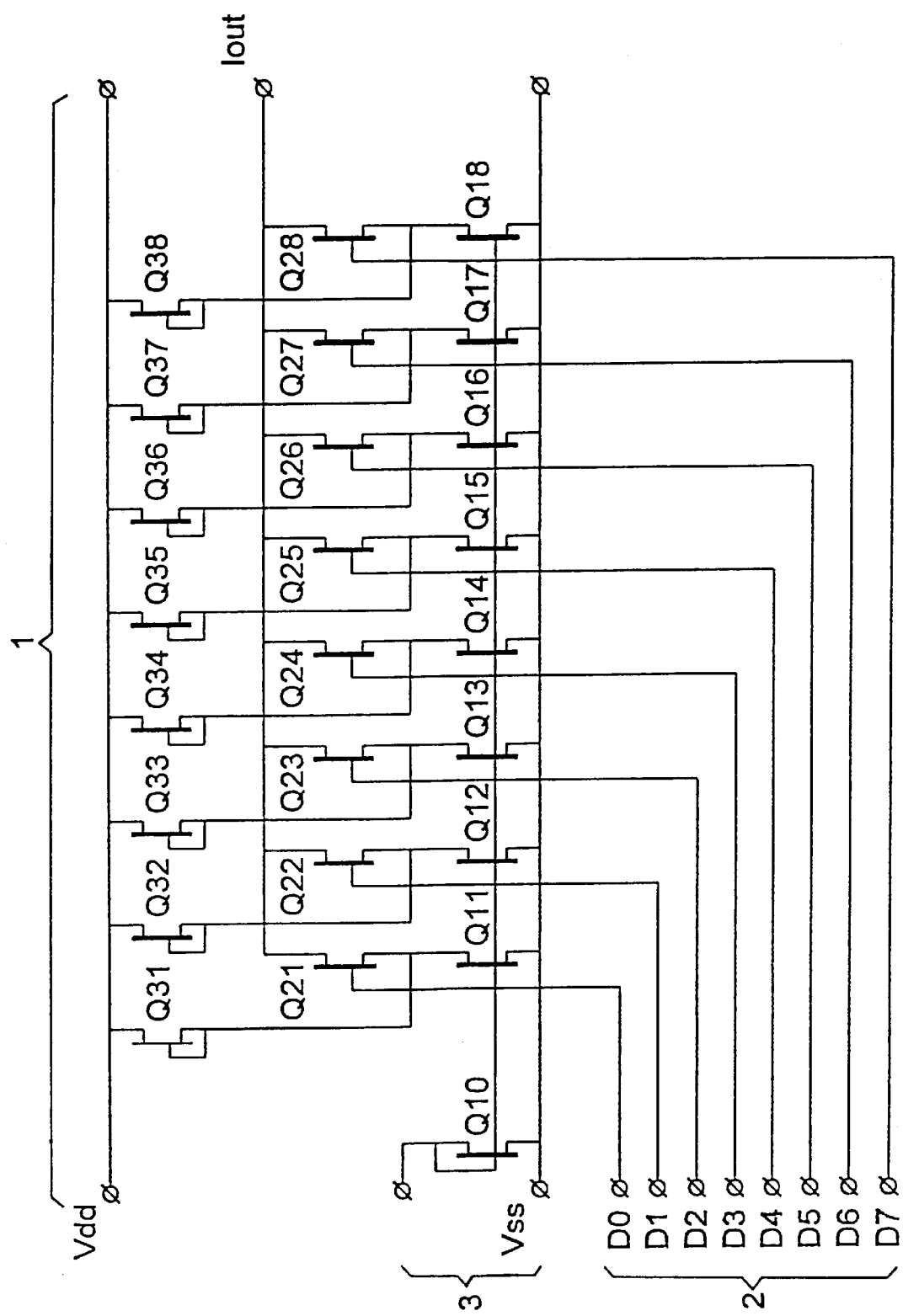

METHOD AND ELECTRONIC CIRCUITRY FOR PROVIDING A STABLE DIGITAL TO ANALOG CONVERTER ANALOG OUTPUT IN INTEGRATED CIRCUIT DIGITAL TO ANALOG CONVERTER APPLICATIONS

CROSS-REFERENCE TO RELATED APPLICATION

This application claims priority of European Patent Application No. 98500148.6, which was filed on Jun. 23, 1998.

The present invention relates to a method and electronic circuitry for providing a stable Digital to Analog Converter analog output in Integrated Circuit Digital to Analog Converter applications.

For modern communication devices the trend is to integrate as much functionality as possible into the digital domain, which can be made low-cost with a high repeatability in existing digital chip technologies. Usually in communication devices a Digital Signal Processor (DSP) is the last/first digital device before the data is transferred to/from the analog domain. Therefore at the digital-analog boundary a digital to analog interface is needed, transferring the time-discrete digital data into a continuous analog format. Usually there is a Digital to Analog Converter (DAC) for signals going from the digital to analog domain, and an Analog to Digital Converter for signals travelling in the opposite direction.

The present invention relates to Integrated Circuit Digital to Analog Converter applications. In a DAC an analog output value is outputted at the converter output that is under control of the digital input value of the DAC. Such converters are for example applied in radio communication devices and generate the voltage input for the modulator in the radio by, e.g. changing the current to output load resistors. Therefore, such a converter is also referred to as an IDAC.

Since the analog output value of a converter is influenced by an internal reference current source of the associated chip which may vary between different chips due to wafer process variations that are inherent to the design of manufacture of CMOS silicon circuits, the said analog output value in practice is not always stable and may be subject to change after chip replacement, since any chip has its own unique reference value.

However, a high degree of accuracy for the DAC analog output is required from chip to chip (stable over temperature and supply changes, independent on transistor parameters of that particular chip, and stable for transistor parameter variation from chip to chip) in order to ensure an excellent operation of the converter.

A chip is a collection of transistor structures with determined circuit properties. Usually the functions on the chip are accessible for external electronic circuit use. The invention is thought to be implemented within a Chip, based upon the usage of a Complimentary Metal Oxide Semiconductor (CMOS) process implemented on a Silicon substrate.

The high accuracy can, in principle, be met in today's Integrated Circuit technology. Such Integrated Circuit technology is known to those skilled in the art and will therefore not be described in detail. However, to achieve such a desired high accuracy in a low cost commercial (i.e. minimum mask level needed for production) digital CMOS IC's processes is very difficult. This is due to the fact that there is large device (i.e. the circuit transistors) parameter variation from chip to chip. By implementing an integrated circuit reference cell this dependency can be solved. However, in general, a high accuracy integrated circuit reference cell providing a stable reference cannot be implemented in a low cost digital CMOS process. The fact that this digital CMOS process is considered low cost is given by the fact that there is a minimum mask set required for device manufacturing (masks are used in the manufacturing process giving way to mass-production, relying on photographic exposure for device fabrication), this in contrast with high accuracy analog processes (e.g. bipolar and CMOS combined) that requires substantial more mask sets. For implementing high accuracy reference cells more complicated device elements are needed, requiring more mask sets (i.e. a more lengthy fabrication process, and likely improved chance for induced errors, lowering the yield and thus increasing the chip price).

There is a need for a low cost, simple circuit structure, integrated circuit reference cell, that forms a stable reference for a DAC and it is therefore an object of the present invention to provide a method and electronic circuitry for providing a stable Digital to Analog converter analog output in Integrated Digital to Analog Converter applications, said output being independent on the associated integrated circuit reference cell.

The invention therefore provides a method for providing a Digital to Analog converter analog output in Integrated Circuit Digital to Analog Converter applications, said analog output being stable over temperature and supply changes, independent on transistor parameters of a particular chip, and stable for transistor parameter variation from chip to chip, comprising: the steps of implementing an integrated circuit reference cell (primary reference quantity); generating an internal (secondary) reference quantity determining the analog Digital to Analog Converter output; referencing the said internal (secondary) reference quantity for the Digital to Analog converter to an chip device specific internal (primary) reference output from the chip in question, and processing further the said chip device specific internal (primary) reference output, in order to derive a fixed predetermined DAC reference value, that is equal for any chip; said fixed predetermined DAC reference value being supplied to the said Digital to Analog converter.

The invention further provides an electronic circuitry for providing a Digital to Analog converter analog output in Integrated Circuit Digital to Analog Converter applications, said analog output being stable over temperature and supply changes, independent on transistor parameters of a particular chip, and stable for transistor parameter variation from chip to chip, comprising an integrated circuit reference cell; means for generating an internal (secondary) reference quantity determining the analog Digital to Analog Converter output; means for referencing the said internal (secondary) reference quantity for the Digital to Analog converter to a chip device specific internal (primary) reference output from the chip in question; means for processing further the said chip device specific internal (primary) reference output, in order to derive a fixed predetermined DAC reference value that is equal for any chip; and means for supplying the said fixed predetermined DAC reference value to the said Digital to Analog converter.

In this manner the internal reference quantity is scaled in such a manner that the DAC converter output gets biased for the required output and a DAC design is achieved with equal characteristics for any chip, wherein the reference source of the chip which advantageously relies on the bare transistor saturation current that varies from batch to batch, and to a lesser extent from chip to chip that do come from the same batch provides a unique scaling-value.

Due to the simple circuit structure the additional die-area (area needed on chip) is minimal, and thus no significant chip price increase is caused by the addition of the DAC converter.

Further there is no need for integration of high accuracy reference sources within the Integrated Circuit (that usually requires a more costly manufacturing process, i.e. more process masks step).

Figure 2A:
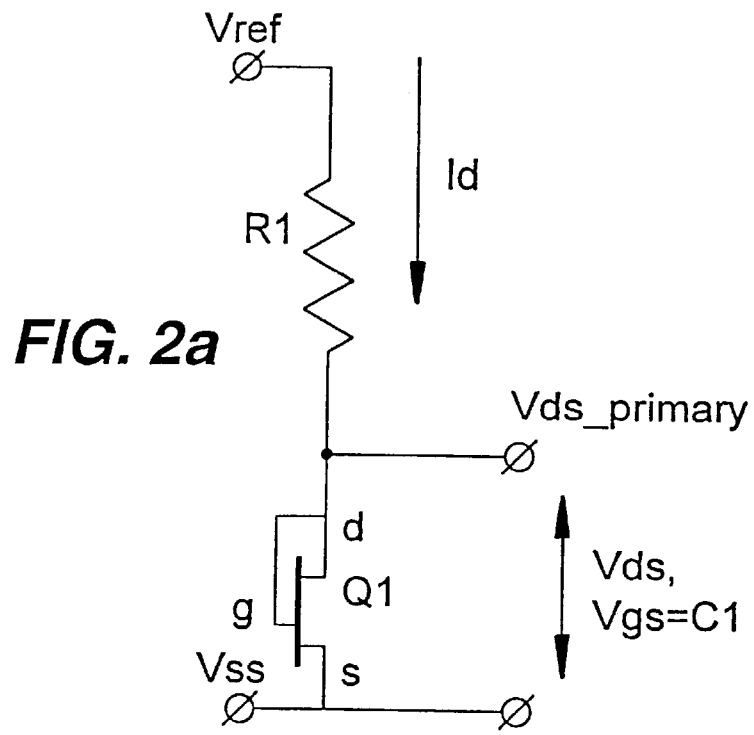

The invention will now be described by way of example in more detail by reference to the accompanying drawings, in which:

FIG. 1 represents schematically a DAC implementation according to the present invention; and FIGS. 2a, b represent schematically a primary reference current generator and its characteristics respectively.

Referring now to FIG. 1, a simplified 9-level current source under digital control D0 . . . D7 has been shown schematically. The DAC 1 has an analog output that is under control of the digital input codes 2 to the DAC 1. In this example the internal reference quantity is the internal reference current. There is only one internal (secondary) reference 3 to which the DAC output current is referenced. This internal reference current is chip parameter independent while yielding a high accuracy DAC output value. The internal (secondary) reference 3 is connected in any way suitable for the purpose to a primary reference quantity generator (not shown for reasons of clarity; this primary reference quantity generator will be described in more detail below by reference to FIGS. 2a and 2b) The DAC high accuracy and stability is achieved by locking the DAC output current to the internal (secondary) reference current. The novel approach here is that this secondary internal reference current for the DAC is referenced to the on-chip device specific primary reference current. Advantageously, as a primary reference current generator the saturation current of a FET transistor can be applied. Since this saturation current of the FET transistor is device specific, and has a huge variation between devices from different Integrated Circuit fabrication runs ("batches") a simple programmable support-DAC converter can be used to multiply the primary device specific saturation current of the FET transistor to the secondary DAC reference current. Such a support-DAC converter advantageously is applied between the FET transistor and said internal (secondary) reference 3 and has not been shown for reasons of clarity.

Figure 2B:
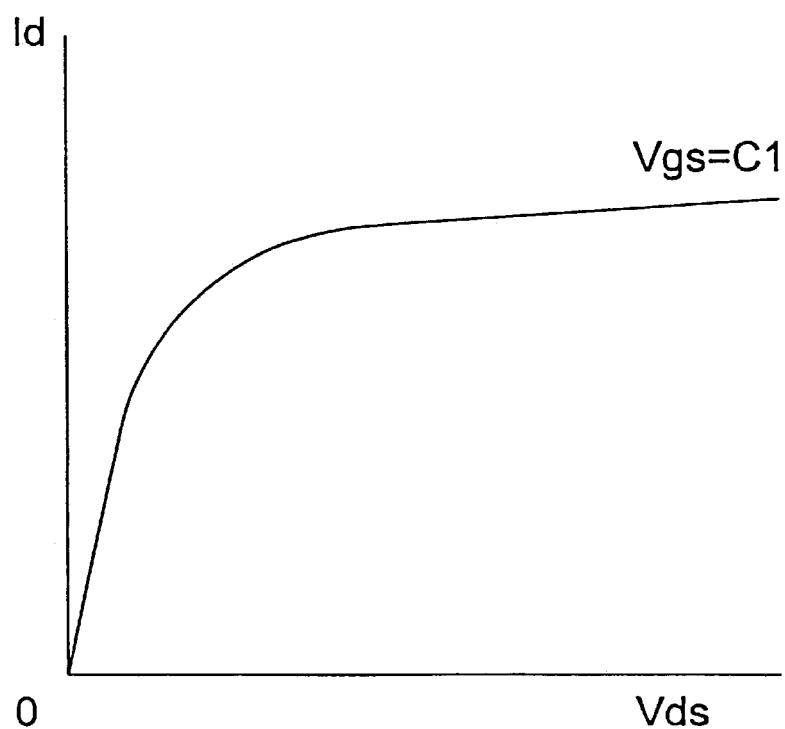

The saturation current for the FET transistor as commonly used in Integrated Circuits is represented by Id (see FIGS. 2a, b). In FIG. 2a the drain, source and gate of the transistor are represented by d, s and g respectively. Since FET transistors are generally known to those skilled in the art, the operation thereof will not be described in much detail. The saturation current is the current flowing through the transistor under the condition for a specific gate-source voltage, and the drain-source voltage is above the threshold value. Referring now to FIGS. 2a and 2b for a FET transistor a unique relation between the drain current Id, the drainsource voltage Vds and the gate-source voltage Vgs is graphically shown. For the transistor in FIG. 2a the resistor R1 biases the transistor such that for the resulting Id a unique Vgs is created, having a constant value C1. This is how the primary reference current is created. As can be seen on the Id-Vgs curve of FIG. 2b, Id is rather independent on Vds, since the curve is almost flat for the area where the transistor is biased. Therefore, it is independent on the supply voltage to R1 as well. In other words, for a varying Vds the change in Id is near zero. Under these conditions the saturation current is relatively stable, and supply variations between the drain-source have little or no influence upon the saturation current (as long as the drain-source voltage is above the threshold voltage). Thus a current source is created, for which the output current is nearly constant.

To have consequent and repeatable DAC behavior the multiplication value between the primary, device specific saturation current of the FET transistor, and secondary DAC reference current has to be programmed into the support-DAC before operation (e.g. at power up and/or reset conditions) Since the saturation current of the FET transistor is device specific it shall be clear that the multiplication factor is therefore device specific. This chip unique value can be stored in a non-volatile memory (e.g. EEPROM; Electrically Erasable Programmable Read-Only Memory) within the product that contains the DAC. This can be either on chip (if the design allows for this), or external to the chip.

Since the secondary reference current determines the analog DAC output, it is necessary to program the support-DAC such that the secondary reference current is equal for any chip. Only this way a DAC output value that is chip independent can be achieved, hiding the internals complexity for the end-user.

Since the DAC output value is matched to the internal saturation current of the FET transistor, it shall remain almost constant over temperature, supply and ageing influences.

From above it shall be clear that for each DAC a high degree of accuracy and repeatability is achieved. For chip to chip accuracy the additional DAC needs to be set such that the output range and resolution of the DAC is the same for any chip. Since the DAC is meant for a low cost commercial application, the resolution in this additional DAC is therefore limited. This results in a chip to chip DAC output range match of about 10%, assuming a correctly programmed support-DAC. The finished chip repeatability of about 10% is usually compensated for in the analog circuitry following the DAC.

Since a simple straightforward circuit implementation as presented here, without error amplifier and feedback, shall always have a variation over temperature and supply changes. To limit this change, the FET transistor that generates the saturation current can be supplied by an external reference voltage. Usually there is one of more reference voltage available in an additional electronic circuitry such as a radio design that can be used for this purpose.

The operation of the circuitry according to the invention is as follows.

For the sake of simplicity, a simplified schematic and description is presented as an explanation for a possible implementation of a 9-level DAC with current-source output. Reference is made again to FIG. 1.

The output for the DAC is a current under digital control. There are 9 output current values possible, i.e. 1, 2, . . . 8 times the secondary reference value Iref_sec, generated by applying the appropriate drain-source respectively gate-source voltage to Q10, being the multiplied primary reference current.

Transistors Q10 through Q18 are all of the same type, orientation, and size, therefore the drain current, being the reference current Iref_sec, flowing through transistor Q10 shall cause a unique Vgs "belonging" to that particular current Id.

This drain-source voltage is "mirrored" to Q11 through Q18, causing an identical current of value Iref_sec in these transistors.

By means of transistor Q21 through Q28 the current through each transistor Q11 through Q19 is switched to the D/A converter output.

Two conditions are possible, Q2x conducting or nonconducting, wherein x=1 . . . 8:

1. For a fully conducting Q1x this transistor shall let the mirrored reference current from the transistor below Q2x flow to the D/A output.

2. For Q2x in the off-condition the mirrored reference current from the transistor Q1x below shall be clamped by transistors Q3x to the positive supply. Clamping maintains the current through Qlx, thereby achieving a faster D/A output current settling.

Since the DAC as developed has a symmetrical output, there are two outputs having opposite polarity. The converter can thus be considered as having two output stages as shown in FIG. 1. To achieve symmetrical output the sum of the output current of the two converters is constant, and is 9 times the reference current.

It will be appreciated by those skilled in the art that the present invention is not restricted to a 9-level DAC with current-source output. Any level suitable for the purpose is applicable. Further, a voltage-source output can be applied.

Advantageously, the invention applies to a "Multiplying DAC". This is a DAC where the output signal is under control of a digital input code, and can be varied in size by changing the multiplication factor. However, these Multiplying DACs are relying on high accuracy cells and processes. The invention described here does not use the multiplier to change the DAC output, referenced to the (primary) reference (for a particular digital input), but to keep the output of the DAC constant, independent of the (primary) reference (for a particular digital input code) by changing the multiplier setting.

In a more advantageous embodiment the invention is implemented in wireless LAN adapters.

The DSP (Digital Signal Processor) in such a design employs a plurality of analog cells, that are the interface between the digital and the analog domain. In this embodiment of the invention the DSP is fabricated in a 0.5 uM CMOS process.

Two of these cells are the Transmit Digital to Analog Converter Cells (DAC). The DAC output is current based, therefore, reference is made to the cells as IDAC. The IDAC provides nine different output current levels, that are under direct DSP control. These output currents are converted into a voltage using external resistors. This results in a voltage, that may serve as the modulator input for a radio.

In the design the current sources are referenced to an internal current source, giving high accuracy between all the current sources on the chip (rely on matching transistor sizes).

Additionally, due to the simple circuit structure, the design is implemented in the I/O pad area, consuming no additional die area on the main die.

It will be appreciated by those skilled in the art that the present invention is not restricted to an IDAC. Other reference quantities can be applied, e.g. voltage, which leads to a voltage DAC.

Various modifications of the present invention will become apparent to those skilled in the art from the foregoing description. Such modifications are intended to fall within the scope of the appended claims.

What is claimed is:

1. A method for providing a Digital to Analog converter analog output in Integrated Circuit Digital to Analog Converter applications, said analog output being stable over temperature and supply changes, independent on transistor parameters of a particular chip, and stable for transistor parameter variation from chip to chip, comprising:

the steps of implementing an integrated circuit reference cell (primary reference quantity);

generating an internal (secondary) reference quantity determining the analog Digital to Analog Converter (DAC) output;

referencing the said internal (secondary) reference quantity for the Digital to Analog converter to an chip device specific internal (primary) reference output from the chip in question, and processing further the said chip device specific internal (primary) reference output, in order to derive a fixed predetermined DAC reference value, that is equal for any chip; and said fixed predetermined DAC reference value being supplied to the said Digital to Analog converter.

2. The method as claimed in claim 1, wherein the step of processing further the said chip device specific internal (primary) reference output comprises the step of trimming said output by multiplication of said output to the said fixed predetermined reference value.

3. The method as claimed in claim 2, wherein the said multiplication is initiated upon chip power or chip reset.

4. The method as claimed in claim 1, wherein the said chip device specific internal (primary) reference output is the saturation current for a FET transistor of the said chip.

5. The method as claimed in claim 1, wherein the said step of processing further the said chip device specific internal (primary) reference output is achieved in a programmable additional support Digital to Analog Converter.

6. The method as claimed in claim 5, wherein the said Support Digital to Analog Converter is programmed before operating the said Integrated Circuit Digital to Analog Converter applications.

7. The method as claimed in claim 2, wherein a multiplication factor is stored in a non-volatile memory within a product that contains the Digital to Analog converter.

8. The method as claimed in claim 7, wherein the said non-volatile memory is an EEPROM (electrically erasable programmable read-only memory).

9. The method as claimed in claims 7, wherein said storing is on the said chip or external to said chip.

10. The method as claimed in claim 4, wherein the said FET transistor that generates the said chip device specific (primary) reference current is supplied by an external reference voltage.

11. The method as claimed in claim 10, wherein the said external reference voltage is a reference voltage available in an additional electronic circuitry such as a radio design.

12. An electronic circuitry for providing a Digital to Analog converter analog output in Integrated Circuit Digital to Analog Converter applications, said analog output being stable over temperature and supply changes, independent on transistor parameters of a particular chip, and stable for transistor parameter variation from chip to chip, comprising an integrated circuit reference cell;

means for generating an internal (secondary) reference quantity determining the analog Digital to Analog Converter output;

means for referencing the said internal (secondary) reference quantity for the Digital to Analog converter to a chip device specific internal (primary) reference output from the chip in question;

means for processing further the said chip device specific internal (primary) reference output, in order to derive a fixed predetermined DAC reference value that is equal for any chip; and means for supplying the said fixed predetermined DAC reference value to the said Digital to Analog converter.

13. The electronic circuitry as claimed in claim 12, wherein said processing means comprises a means for multiplying said chip device specific internal (primary) reference output to the said fixed predetermined reference value.

14. The electronic circuitry as claimed in claim 12, wherein the said chip device specific internal (primary) reference output is the saturation current for a FET transistor of the chip.

15. The electronic circuitry as claimed in claim 12, wherein said processing means is a programmable support Digital to Analog Converter.

16. The electronic circuitry as claimed in claim 12, wherein a product that contains the said Digital to Analog Converter comprises a non-volatile memory.

17. The electronic circuitry as claimed in claim 16, wherein the said non-volatile memory is an EEPROM (electrically erasable programmable read-only memory).

18. The electronic circuitry as claimed in claim 16, wherein the said non-volatile memory is arranged on a chip or external to the chip.

* * * * *